United States Patent
Luo et al.

(10) Patent No.: US 10,797,263 B2
(45) Date of Patent: Oct. 6, 2020

(54) DISPLAY SUBSTRATE, DISPLAY PANEL, DISPLAY DEVICE, AND FABRICATION METHOD OF DISPLAY SUBSTRATE

(71) Applicant: BOE TECHNOLOGY GROUP CO., LTD., Beijing (CN)

(72) Inventors: Chengyuan Luo, Beijing (CN); Tao Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/540,139

(22) Filed: Aug. 14, 2019

(65) Prior Publication Data
US 2020/0274088 A1    Aug. 27, 2020

(30) Foreign Application Priority Data
Feb. 26, 2019    (CN) .......................... 2019 1 0140573

(51) Int. Cl.
*H01L 51/52* (2006.01)
*H01L 51/56* (2006.01)

(52) U.S. Cl.
CPC ........ *H01L 51/524* (2013.01); *H01L 51/5206* (2013.01); *H01L 51/5221* (2013.01); *H01L 51/56* (2013.01)

(58) Field of Classification Search
CPC .............. H01L 51/524; H01L 51/5221; H01L 51/5206; H01L 51/56
See application file for complete search history.

(56) References Cited

U.S. PATENT DOCUMENTS

| 2008/0105455 A1* | 5/2008 | Palfreyman | .......... H05K 1/0271 |
| | | | 174/254 |
| 2011/0075384 A1* | 3/2011 | Yeates | .................. H05K 1/0271 |
| | | | 361/752 |

FOREIGN PATENT DOCUMENTS

| CN | 106601776 A | 4/2017 |
| CN | 107425039 A | 12/2017 |
| CN | 108807494 A | 11/2018 |
| CN | 208173590 U | 11/2018 |

OTHER PUBLICATIONS

China First Office Action, Application No. 201910140573.7, dated Jun. 23, 2020, 14 pp. with English translation.

* cited by examiner

*Primary Examiner* — Karen Kusumakar
(74) *Attorney, Agent, or Firm* — Armstrong Teasdale LLP

(57) ABSTRACT

Embodiments of the present disclosure relate to a display substrate, a display panel, a display device, and a fabrication method of the display substrate. The display substrate includes a flexible substrate having a plurality of pixel regions, and at least one groove positioned in the flexible substrate and surrounding each of the pixel regions. At least a portion of the at least one groove is curved.

20 Claims, 4 Drawing Sheets

DISPLAY SUBSTRATE, DISPLAY PANEL, DISPLAY DEVICE, AND FABRICATION METHOD OF DISPLAY SUBSTRATE

CROSS REFERENCE TO RELATED APPLICATIONS

This patent application claims the benefit and priority of Chinese Patent Application No. 201910140573.7 filed on Feb. 26, 2019, the disclosure of which is incorporated by reference herein in its entirety as part of the present application.

BACKGROUND

Embodiments of the present disclosure relate to the field of display technologies, and more particularly, to a display substrate, a display panel, a display device, and a fabrication method of the display substrate.

Organic light-emitting diode (OLED) display devices, also referred to as organic electroluminescent display devices, are display devices different from conventional liquid crystal display (LCD). Such display technology is simple in structure, self-luminous, high in contrast, small in thickness, wide in view angle, quick in response, and applicable to flexible panels, etc. Therefore, the OLED display devices have become one of importance development directions of a new generation of display devices, and attract more and more attention.

As one of importance development directions of flexible display products, stretchable OLED display devices may be used in wearable devices or even clothes, and thus attract extensive attention.

BRIEF DESCRIPTION

An aspect of the present disclosure provides a display substrate. The display substrate may include a flexible substrate having a plurality of pixel regions, and at least one groove positioned in the flexible substrate and surrounding each of the pixel regions. At least a portion of the at least one groove is curved.

In one or more embodiments of the present disclosure, the groove is curved toward the pixel region surrounded by the groove.

In one or more embodiments of the present disclosure, the pixel region is rectangular, and each groove surrounds two adjacent sides of the pixel region.

In one or more embodiments of the present disclosure, a depth of the groove is not less than ⅔ of a thickness of the flexible substrate.

In an exemplary embodiment, the groove may be a hollow structure that penetrates through the flexible substrate.

In one or more embodiments of the present disclosure, a straight-line distance L between two ends of the groove satisfies: $L \geq \sqrt{X^2+Y^2}/2$ wherein X and Y represent dimensions of each pixel region in a length direction and a width direction, respectively.

In one or more embodiments of the present disclosure, the at least one groove includes a plurality of grooves, and the display substrate further includes at least one material layer which at least partially covers a gap between adjacent grooves.

In one or more embodiments of the present disclosure, an orthographic projection of the groove on the flexible substrate does not overlap with an orthographic projection of the material layer on the flexible substrate.

In one or more embodiments of the present disclosure, the material layer includes at least one of a wiring layer, a passivation layer, or a packaging layer.

In one or more embodiments of the present disclosure, a minimum distance between adjacent grooves surrounding the same pixel region is not less than approximately 20 m.

In one or more embodiments of the present disclosure, a shape of the groove includes at least one of a parabolic shape or an arc shape.

In one or more embodiments of the present disclosure, the display substrate further includes one or more sub-pixel structures positioned on each of the pixel regions on the flexible substrate. In an exemplary embodiment, each of the pixel regions is fit for forming three to six sub-pixel structures thereon.

In one or more embodiments of the present disclosure, the flexible substrate is a polyimide substrate.

Another aspect of the present disclosure provides a display panel, which may include any display substrate in one or more embodiments described herein.

Still another aspect of the present disclosure provides a display device, which may include the display panel described herein.

Still another aspect of the present disclosure provides a method for fabricating a display substrate. The method includes providing a flexible substrate having a plurality of pixel regions, and forming at least one groove positioned in the flexible substrate and surrounding each of the pixel regions, at least a portion of the at least one groove being curved.

In one or more embodiments of the present disclosure, the at least one groove is formed to be curved toward the pixel region surrounded by the at least one groove.

In one or more embodiments of the present disclosure, before forming the at least one groove, the method further includes forming a passivation layer on the flexible substrate, and forming one or more sub-pixel structures and wirings connected to the sub-pixel structures on the passivation layer in each of the pixel regions of the flexible substrate.

In one or more embodiments of the present disclosure, after forming the sub-pixel structures, the method further includes forming a packaging layer for sealing the sub-pixel structures on the flexible substrate.

In one or more embodiments of the present disclosure, forming the at least one groove includes removing, around the pixel region, the packaging layer, the passivation layer, and at least a portion of the flexible substrate to form the at least one groove.

In an exemplary embodiment of the present disclosure, the packaging layer, the passivation layer, and at least a portion of the flexible substrate may be removed by a plasma etching process.

Further adaptive aspects and scopes become apparent from the description provided herein. It should be understood that various aspects of the present disclosure may be implemented separately or in combination with one or more other aspects. It should also be understood that the description in the present disclosure and objectives which are intended to be merely described in the specific embodiments are not intended to limit the scope of the present disclosure.

BRIEF DESCRIPTION OF THE DRAWINGS

The drawings described herein are for illustrative purposes only of selected embodiments and not all possible implementations, and are not intended to limit the scope of the present disclosure, in which.

Corresponding reference numerals indicate corresponding parts or features throughout the several views of the drawings.

DETAILED DESCRIPTION

Various embodiments will now be described in detail with reference to the drawings, which are provided as illustrative examples of the disclosure so as to enable those skilled in the art to practice the disclosure. Notably, the figures and the examples below are not meant to limit the scope of the present disclosure. Where certain elements of the present disclosure may be partially or fully implemented using known components (or methods or processes), only those portions of such known components (or methods or processes) that are necessary for an understanding of the present disclosure will be described, and the detailed descriptions of other portions of such known components (or methods or processes) will be omitted so as not to obscure the disclosure. Further, various embodiments encompass present and future known equivalents to the components referred to herein by way of illustration.

In addition, where an element and an embodiment thereof in this application are introduced, articles "a" "an", "said" and "the" may be intended to indicate one or more elements are present. Unless otherwise stated, "a plurality of" means two or more than two. Expressions "comprise", "include", "contain" and "have" are as well as grammatical variations thereof are used in a non-exclusive way. Thus, the expression "A has B" as well as the expression "A comprises B" or "A contains B" may both refer to the fact that, besides B, A contains one or more further components and/or constituents, and to the case in which, besides B, no other components, constituents or elements are present in A.

Figure 1:
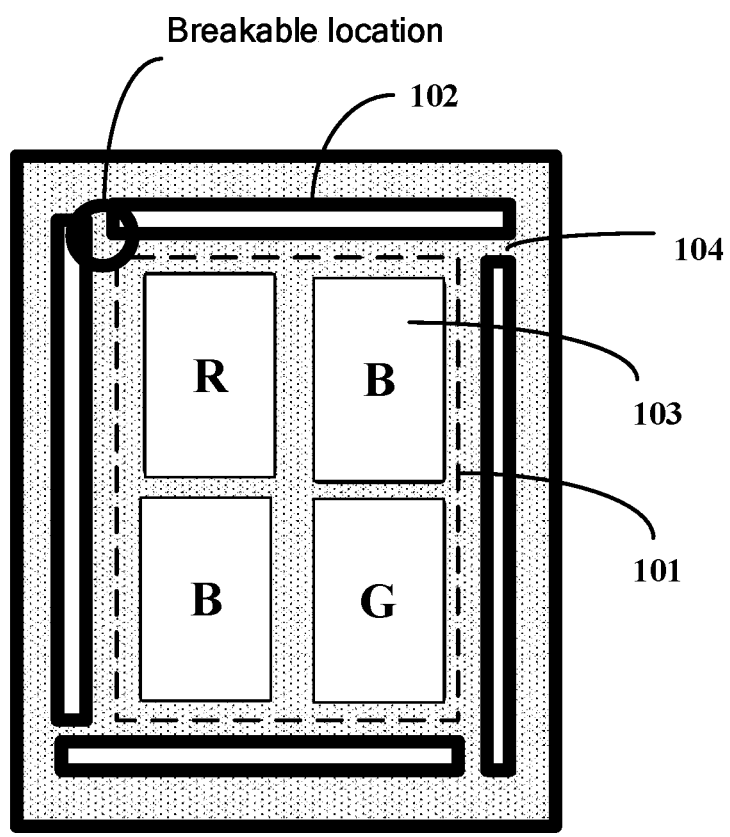
FIG. 1 illustrates a schematic diagram of a flexible substrate in related technologies.

In the stretchable flexible display technology, generally a groove is formed around each pixel region of a flexible substrate of a flexible display panel, such that the flexible display panel is prone to deformation when being stretched without having a negative effect on the display effect. FIG. 1 illustrates a schematic diagram of a flexible display panel in related technologies. As shown in FIG. 1, for example, four grooves 102 are formed around each pixel region 101 of the flexible substrate of the flexible display panel, wherein each of the grooves 102 is parallel to a respective side of the pixel region 101. The four grooves 102 form a rectangle, and the adjacent grooves are not connected, such that there is a gap 104 between the adjacent grooves. In this way, wires connected to sub-pixel structure 103 in the pixel region 101 may be directed to the outside of the pixel region 101 through the gap 104. However, the adjacent grooves 102 in FIG. 1 are perpendicular to each other, mutually orthogonal stresses are easily generated when being stretched, and the orthogonal stresses concentrate at the gap. Therefore, it is easy to cause breakage of a wiring layer and other film layers with a lower flexibility than the flexible substrate at the gap.

An embodiment of the present disclosure provides a display substrate. By forming curved grooves at the periphery of the pixel region, the stresses may be dispersed in various directions, such that a potential risk of breakage of a material layer on the flexible substrate when being stretched due to stress concentration may be prevented.

Figure 2:
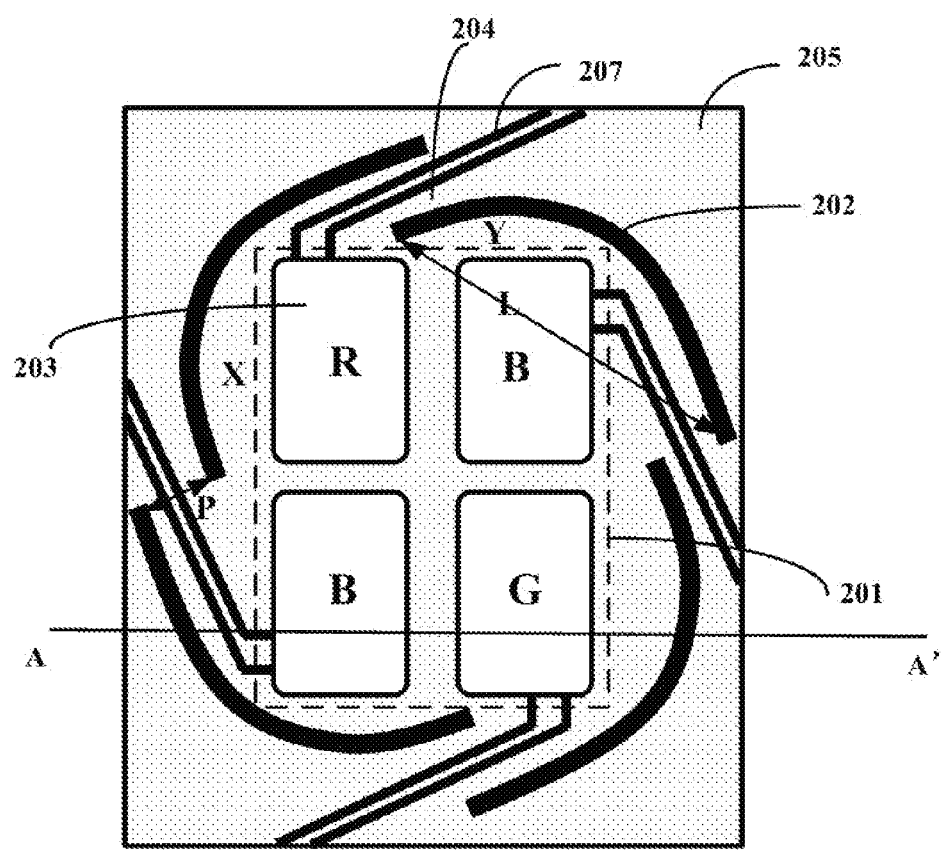
FIG. 2 illustrates a schematic diagram of a flexible display panel according to some exemplary embodiments of the present disclosure.

FIG. 2 illustrates a schematic diagram of an exemplary display substrate according to some embodiments of the present disclosure. As shown in FIG. 2, the display substrate may include a flexible substrate 205 having a plurality of pixel regions 201, and at least one groove 202 positioned in the flexible substrate 205 and surrounding each of the pixel regions 201. At least a portion of the at least one groove 202 is curved.

In an exemplary embodiment, the at least one groove 202 may be curved toward the pixel region 201 surrounded by the groove 202. However, it is to be understood that the curving direction of the groove in this embodiment of the present disclosure is not limited to being curved toward the respective pixel region surrounded by the groove 202 illustrated in FIG. 2. Other embodiments are also feasible. For example, in other embodiments, the at least one groove may also be curved toward a direction facing away from the respective pixel region surrounded by the groove 202.

As shown in FIG. 2, the pixel region may be, but is not limited to, rectangular, and each groove surrounds two adjacent sides of the pixel region.

As used herein, the "pixel region 201" refers to one or more regions, where one or more sub-pixel structures 203 may be formed, on the flexible substrate 205. In the embodiment shown in FIG. 2, four sub-pixel structures 203 may be formed in each of the pixel regions 201. It is to be understood that the number of the sub-pixel structures 203 that may be formed in each of the pixel regions 201 is not limited to four. Any number of sub-pixel structures 203 may be formed in each of the pixel regions 201 as needed. As an example, each of the pixel regions 201 may also be adapted to form three to six sub-pixel structures 203 thereon.

Herein, as a basic light-emitting unit for displaying an image, the "sub-pixel structure 203" may include, for example, a thin film transistor, a cathode, an anode, a pixel defining layer, and a light-emitting material layer between the cathode and the anode, etc. In some embodiments described herein, the sub-pixel structures 203 may include red (R) sub-pixel structures, green (G) sub-pixel structures, or blue (B) sub-pixel structures.

In some embodiments of the present disclosure, the at least one groove 202 may include a plurality of grooves, for example, four. As an example, the plurality of grooves 202 may form a vortex pattern at the periphery of the pixel region 201.

The display substrate may also include at least one material layer which at least partially covers a gap 204 between adjacent grooves 202. As an example, an orthographic projection of the groove on the flexible substrate does not overlap with an orthographic projection of the material layer on the flexible substrate. As an example, a flexibility of the material layer may be lower than that of the flexible substrate. In an exemplary embodiment, the material layer may include, for example, at least one of a wiring layer 207, a passivation layer, or a packaging layer (not shown in FIG. 2).

As described above, the curved groove 202 provided at the periphery of the pixel region 201 may disperse the tensile stress in various directions, such that the material layer on the flexible substrate 205 may be prevented from being broken due to stress concentration.

In an exemplary embodiment, the wiring layer 207 may include at least one of a data line or a scan line connected to the sub-pixel structure 203. The wiring layer 207 may be made of, for example, a metal material. The passivation layer and the packaging layer may be formed of one or more of $SiN_x$, $SiO_x$, and SiON.

In one or more embodiments, a shape of the groove 202 may be at least one of a parabolic shape or an arc shape. By setting the shape of the groove 202 into the parabolic shape or the arc shape, the tensile stress may be more effectively dispersed in various directions, such that stress concentration may not occur, and thus breakage of the material layer at the gap of the groove may be prevented.

It is be noted that, in order to demonstrate particular effects, advantages and feasibility of the present disclosure, the parabolic or arc-shaped groove is, in general, employed herein as an exemplary shape of the groove, which representation is, however, not intended to limit the scope of the present disclosure to the specific shape of the groove. By virtue of this example, those skilled in the art may rather easily recognize how to adapt related parameters and conditions when employing a different shape of grooves.

In one or more embodiments, a depth of the groove 202 may be not less than ⅔ of a thickness of the flexible substrate 205. By this configuration, the flexible substrate 205 may be more easily stretched. As a special situation, the groove 202 may be a hollow structure that penetrates through the flexible substrate 205. That is, the groove 202 may penetrate through the flexible substrate 205 in the thickness direction of the flexible substrate 205, such that the hollow structure is formed in the flexible substrate 205.

As used herein, the term "groove" is a broad concept, which may not only include a situation where the groove has a bottom of a certain thickness, but also include a situation where the groove penetrates through the flexible substrate to form a hollow structure. That is, the hollow structure herein constitutes a special situation of the groove.

According to an embodiment of the present disclosure, for the same pixel region, the minimum distance P between adjacent grooves 202 may be not less than approximately 20 m so as to provide a sufficiently large gap 204 between the grooves 202. By setting the gap 204 to be large enough, the material layer such as an inorganic film may cover a sufficiently large area on the gap 204, which may further prevent the material layer from being peeled off or broken. As used herein, the "minimum distance" refers to a distance between two nearest points on two adjacent grooves. Typically, the "minimum distance" occurs near the ends of the adjacent grooves.

In some embodiments, each of the pixel regions 201 may be rectangular. A straight-line distance L between two ends of the groove 202 satisfies: $L \geq \sqrt{X^2+Y^2}/2$, wherein X and Y represent dimensions of each of the pixel regions 201 in a length direction and a width direction, respectively. By setting the straight-line distance between the two ends of the groove 202 long enough, the stress may be more effectively dispersed.

In some exemplary embodiments, the flexible substrate may be, for example, a polyimide substrate.

Figure 3:
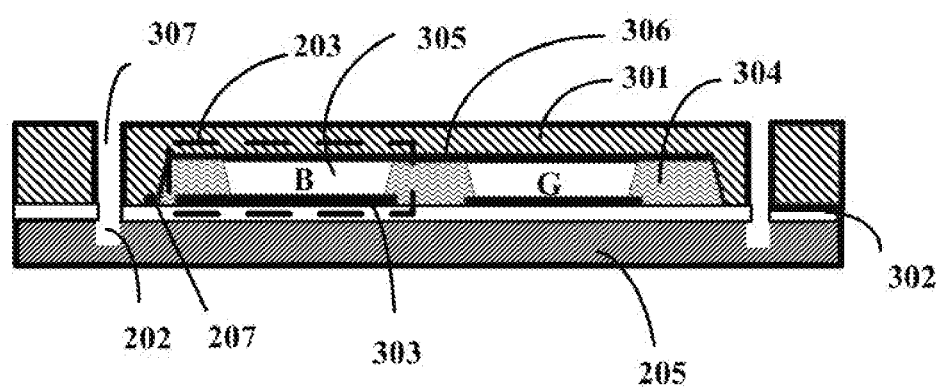
FIG. 3 illustrates a sectional view of a flexible display panel along line AA' in FIG. 2 according to some other exemplary embodiments of the present disclosure.

FIG. 3 illustrates a sectional view of a display panel along line AA' in FIG. 2 according to some exemplary embodiments of the present disclosure. The display substrate in some embodiments of the present disclosure is further described in detail below with reference to FIG. 2 and FIG. 3. In order to facilitate the illustration of the present disclosure and to clearly show the shape and arrangement of the groove of the present disclosure, FIG. 2 only illustrates the flexible substrate of the display substrate, a pixel region, grooves, gaps between the grooves, and wires extending from the gaps, without illustrating other structures on the flexible substrate.

As shown in FIG. 2 and FIG. 3, the display substrate may include a flexible substrate 205 having a plurality of pixel regions 201, four sub-pixel structures 203 positioned in the pixel regions 201 on the flexible substrate 205, four grooves 202 positioned in the flexible substrate 205 and surrounding each of the pixel regions 201, wirings 207 connected to the sub-pixel structures 203 and guided out through the gap between the grooves, and a packaging layer 301 for sealing the sub-pixel structures 203. In this embodiment, the four grooves 202 respectively correspond to the four sub-pixel structures 203, and each of the four grooves 202 is curved toward the corresponding sub-pixel structure 203 surrounded by the groove. According to some embodiments of the present disclosure, the display substrate may further include a passivation layer 302 between the flexible substrate 205 and the sub-pixel structure 203.

In the embodiment as shown in FIG. 2, each groove corresponds to one sub-pixel structure. However, the present disclosure is not limited thereto. As an example, one groove may correspond to two or even more sub-pixel structures.

As shown in FIG. 3, each of the sub-pixel structures 203 may at least include a first electrode 303 (one of a cathode and an anode) on the passivation layer 302, a pixel defining layer 304 positioned on the first electrode 303 and having an opening exposing the first electrode 303, a light-emitting material layer 305 positioned in the opening of the pixel defining layer 304, and a second electrode 306 (the other one of the cathode and the anode) positioned on the pixel defining layer 304 and the light-emitting material layer 305.

In some embodiments, the display substrate may also include a through hole 307 that keeps away from the sub-pixel structure 203 and is connected to the groove 202 in the flexible substrate 205. By providing the through hole 307 connected to the groove 202 in the display substrate, it may be avoided a fact that the display substrate may not be easily stretched due to poor elasticity of a film layer of the packaging layer.

Figure 4:
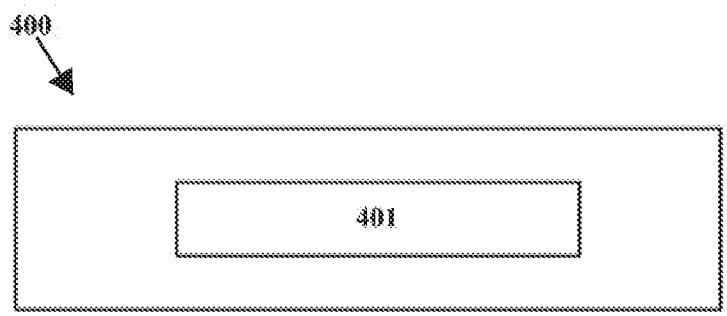
FIG. 4 illustrates a schematic block diagram of a display panel according to some embodiments of the present disclosure.

Another aspect of the present disclosure provides a display panel. FIG. 4 illustrates a schematic block diagram of a display panel 400 according to some embodiments of the present disclosure. As shown in FIG. 4, the display panel 400 may include at least one display substrate 401 according to the present disclosure, such as at least one display substrate 401 according to one or more of the embodiments disclosed above in detail. Therefore, for potential embodiments of the display panel, reference might be made to the embodiments of the display substrate. In some embodiments of the present disclosure, in addition to the display substrate according to one or more embodiments of the present disclosure, the display panel may also include, for example, a drive circuit.

Figure 5:
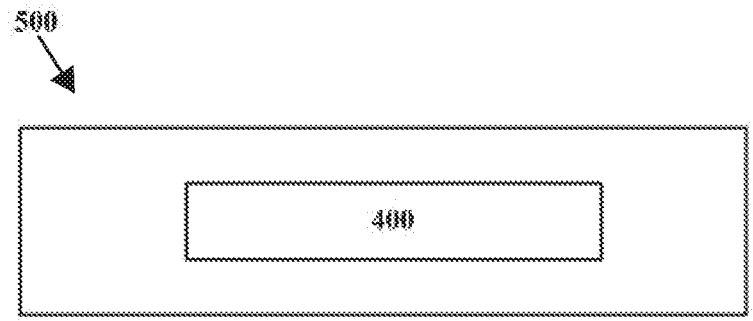
FIG. 5 illustrates a schematic block diagram of a display device according to some embodiments of the present disclosure.

Still another aspect of the present disclosure discloses a display device. FIG. 5 illustrates a schematic block diagram of a display device according to some embodiments of the present disclosure. As shown in FIG. 5, the display device 500 may include at least one display panel 400 of the present disclosure. Therefore, for potential embodiments of the display device, reference may be made to the embodiments of the display panel. In some embodiments of the present disclosure, in addition to the display panel according to one or more embodiments of the present disclosure, the display device may also include, for example, a video signal processing circuit.

Still another aspect of the present disclosure provides a method for fabricating a display substrate. This method may be used for fabricating at least one display substrate according to the present disclosure, such as at least one display substrate according to one or more of the embodiments disclosed above in detail. Therefore, for potential embodiments of the method, reference may be made to the embodiments of the display substrate. The method includes the following steps, which may be performed in given order or in a different order. Furthermore, additional method steps not listed may be provided. Furthermore, two or more or even all of the method steps might be at least partially performed simultaneously. Furthermore, a method step may be performed twice or more, repeatedly.

Figure 6:
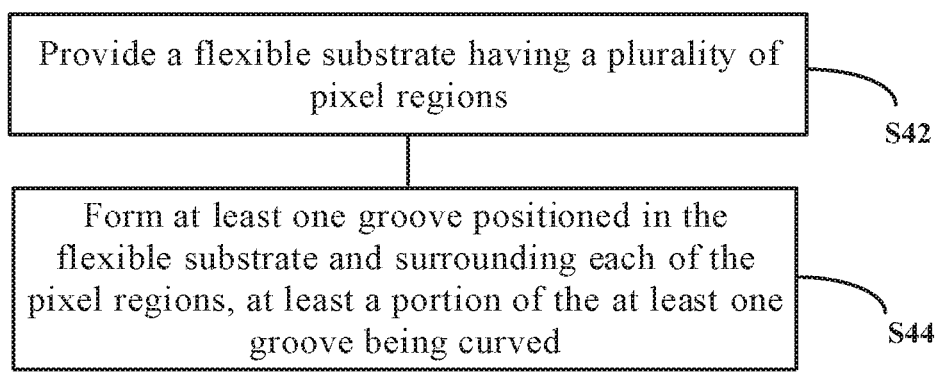
FIG. 6 illustrates an exemplary flowchart of a method for fabricating a flexible display panel according to some embodiments of the present disclosure.

FIG. 6 illustrates an exemplary flowchart of a method for fabricating a display substrate according to some embodiments of the present disclosure. As shown in FIG. 6, the method may include Steps S42 and S44. In Step S42, a flexible substrate is provided, wherein the flexible substrate may have a plurality of pixel regions. In Step S44, at least one groove is formed in the flexible substrate surrounding each of the pixel regions. At least a portion of the at least one groove is curved. The at least one groove is formed to be curved toward the pixel region surrounded by the at least one groove. In one or more embodiments, before the Step S44, a passivation layer also may be first formed on the flexible substrate, and then one or more sub-pixel structures and wirings connected to the sub-pixel structures may be formed on the passivation layer in each of the pixel regions of the flexible substrate. In another embodiment, after the sub-pixel structures are formed, a packaging layer for sealing the sub-pixel structures may also be formed on the flexible substrate. In this case, at least one groove may be formed by removing, around the pixel region, the packaging layer, the passivation layer, and at least a portion of the flexible substrate.

In an exemplary embodiment, the at least one groove may be curved toward the respective pixel region surrounded by the at least one groove. However, it is to be understood that the curving direction of the groove in this embodiment of the present disclosure is not limited to being curved toward the respective pixel region. Other embodiments are also feasible. For example, in other embodiments, the at least one groove may also be curved toward a direction facing away from the respective pixel region surrounded by the groove.

According to the method for fabricating a display substrate provided by some embodiments of the present disclosure, a curved groove is formed around each pixel region in the flexible substrate, such that the curved groove can disperse stress in various directions when the display substrate is stretched. Therefore, breakage of a film layer at the gap between the grooves due to stress concentration may be prevented.

Figure 7:
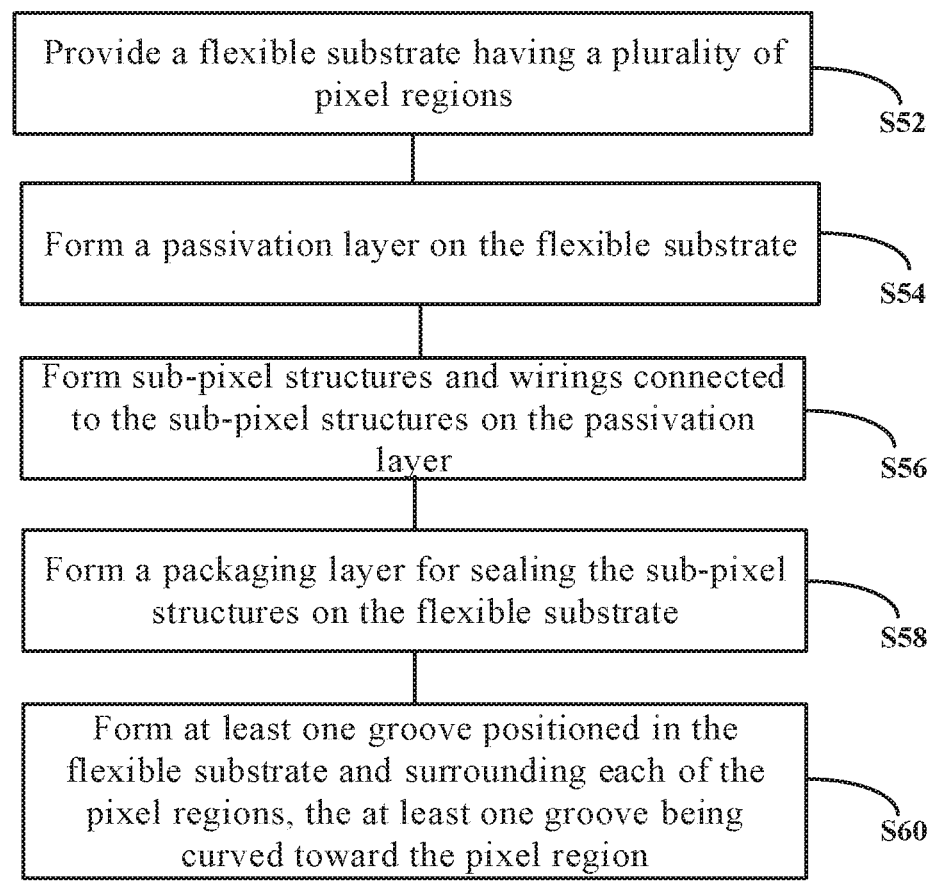
FIG. 7 illustrates another exemplary flowchart of a method for fabricating a flexible display panel according to some embodiments of the present disclosure.

FIG. 7 illustrates another exemplary flowchart of a method for fabricating a display substrate according to some embodiments of the present disclosure. As shown in FIG. 7, the method may include Steps S52, S54, S56, S58, and S60.

In Step S52, a flexible substrate is provided. The flexible substrate may have a plurality of pixel regions. In an exemplary embodiment, the flexible substrate can be made of a polyimide material. In some embodiments of the present disclosure, the flexible substrate may be fabricated by applying a flexible material such as polyimide on a rigid carrier substrate.

In Step S54, a passivation layer is formed on the flexible substrate. In an exemplary embodiment, materials of the passivation layer may include one or more of $SiN_x$, $SiO_x$, and SiON.

In Step S56, one or more sub-pixel structures and wirings connected to the sub-pixel structures are formed on the passivation layer in each of the pixel regions of the flexible substrate. In an exemplary embodiment, each of the sub-pixel structures may at least include a first electrode on the passivation layer, a pixel defining layer positioned on the first electrode and having an opening exposing the first electrode, a light-emitting material layer positioned in the opening of the pixel defining layer, and a second electrode positioned on the pixel defining layer and the light-emitting material layer. As shown in FIG. 2, the wires connected to the sub-pixel structures may be guided out along the gap between adjacent grooves.

In Step S58, a packaging layer for sealing the sub-pixel structures is formed on the flexible substrate. The packaging layer is positioned on the pixel defining layer and the light-emitting material layer. Materials of the packaging layer may include one or more of $SiN_x$, $SiO_x$, and SiON.

In Step S60, at least one groove is formed in the flexible substrate surrounding each of the pixel regions. The at least one groove is curved toward the pixel region surrounded by the at least one groove. In an exemplary embodiment, the groove may be formed by removing, around the pixel region, the packaging layer, the passivation layer, and at least a portion of the flexible substrate. In some embodiments of the present disclosure, the removing step may be performed by a plasma etching process.

The foregoing description of the embodiment has been provided for purpose of illustration and description. It is not intended to be exhaustive or to limit the present disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the present disclosure, and all such modifications are included within the scope of the present disclosure.

What is claimed is:

1. A display substrate comprising:
   a flexible substrate having a plurality of pixel regions; and
   a plurality of grooves positioned in the flexible substrate and surrounding each of the pixel regions, wherein at least a portion of each groove is curved,
   wherein the plurality of grooves form a vortex pattern at a periphery of the pixel region.

2. The display substrate according to claim 1, wherein the groove is curved toward the pixel region surrounded by the groove.

3. The display substrate according to claim 2, wherein the pixel region is rectangular, and wherein each groove surrounds two adjacent sides of the pixel region.

4. The display substrate according to claim 2, wherein a depth of the groove is not less than ⅔ of a thickness of the flexible substrate.

5. The display substrate according to claim 4, wherein the groove is a hollow structure that penetrates through the flexible substrate.

6. The display substrate according to claim 3, wherein a straight-line distance L between two ends of the groove satisfies:

$$L \geq \sqrt{X^2+Y^2}/2$$

wherein X and Y represent dimensions of each pixel region in a length direction and a width direction, respectively.

7. The display substrate according to claim 2, wherein the display substrate further comprises at least one material layer which at least partially covers a gap between adjacent grooves.

8. The display substrate according to claim 7, wherein an orthographic projection of the groove on the flexible substrate does not overlap with an orthographic projection of the material layer on the flexible substrate.

9. The display substrate according to claim 7, wherein the material layer comprises at least one of a wiring layer, a passivation layer, and a packaging layer.

10. The display substrate according to claim 2, wherein a minimum distance between adjacent grooves surrounding the same pixel region is not less than approximately 20 μm.

11. The display substrate according to claim 8, wherein a shape of the groove comprises at least one of a parabolic shape and an arc shape.

12. The display substrate according to claim 1, wherein the display substrate further comprises at least one sub-pixel structure positioned on each of the pixel regions on the flexible substrate.

13. A display panel comprising the display substrate according to claim 1.

14. The display panel according to claim 13, wherein the groove surrounds the pixel region and is curved toward the pixel region surrounded by the groove.

15. The display panel according to claim 14, wherein a straight-line distance L between two ends of the groove satisfies:

$$L \geq \sqrt{X^2+Y^2}/2$$

wherein the pixel region is rectangular, and X and Y represent dimensions of each pixel region in a length direction and a width direction, respectively.

16. The display panel according to claim 13, wherein the display substrate further comprises at least one material layer which at least partially covers a gap between adjacent grooves.

17. A display device comprising the display panel according to claim 13.

18. A method for fabricating a display substrate, the method comprising:
    providing a flexible substrate having a plurality of pixel regions; and
    forming a plurality of grooves positioned in the flexible substrate and surrounding each of the pixel regions, wherein at least a portion of each groove is curved,
    wherein the plurality of grooves form a vortex pattern at a periphery of the pixel region.

19. The method according to claim 18, wherein the at least one groove is formed to be curved toward the pixel region surrounded by the at least one groove.

20. The method according to claim 19, wherein before forming the plurality of grooves, the method further comprises:
    forming a passivation layer on the flexible substrate; and
    forming at least one sub-pixel structure and wirings connected to the sub-pixel structures on the passivation layer in each of the pixel regions of the flexible substrate, wherein after forming the sub-pixel structures, the method further comprises:
    forming a packaging layer for sealing the sub-pixel structures on the flexible substrate, wherein forming the plurality of grooves comprises:
    removing, around the pixel region, the packaging layer, the passivation layer, and at least a portion of the flexible substrate to form the plurality of grooves.

* * * * *

UNITED STATES PATENT AND TRADEMARK OFFICE
CERTIFICATE OF CORRECTION

PATENT NO. : 10,797,263 B2
APPLICATION NO. : 16/540139
DATED : October 6, 2020
INVENTOR(S) : Chengyuan Luo et al.

Page 1 of 1

It is certified that error appears in the above-identified patent and that said Letters Patent is hereby corrected as shown below:

In the Specification

Column 2, Line 8, delete "approximately 20 m" and insert therefor -- approximately 20µm --.
Column 5, Lines 52-53, delete "approximately 20 m" and insert therefor -- approximately 20µm --.

Signed and Sealed this
Twenty-ninth Day of December, 2020

Andrei Iancu
*Director of the United States Patent and Trademark Office*